United States Patent [19]

Le

[11] 4,442,408
[45] Apr. 10, 1984

[54] DIFFERENTIAL AMPLIFIER WITH AUTO BIAS ADJUST

[75] Inventor: Trung Le, Austin, Tex.

[73] Assignee: International Business Machines Corporation, Armonk, N.Y.

[21] Appl. No.: 377,771

[22] Filed: May 13, 1982

[51] Int. Cl.³ .............................................. H03F 3/45
[52] U.S. Cl. .................................................. 330/261
[58] Field of Search ................ 330/259, 260, 261, 252

[56] References Cited

U.S. PATENT DOCUMENTS

| 3,434,069 | 3/1969 | Jones | 330/259 |
| 3,435,365 | 3/1969 | Greeson, Jr. | 330/30 |
| 3,551,836 | 12/1970 | Greeson, Jr. | 330/30 |
| 3,721,914 | 3/1973 | Nakamura | 330/259 |
| 4,396,891 | 8/1983 | Johansson et al. | 330/260 |

OTHER PUBLICATIONS

Burke "Differential Sense Switch," IBM Tech. Disclosure Bulletin, vol. 9, No. 7, Dec. 1966.
IBM Technical Disclosure Bulletin, vol. 6, No. 3, pp. 70-71, "Amplifier with Automatic Gain Control", H. L. Funk (8/63).

Primary Examiner—James B. Mullins
Assistant Examiner—G. Wan
Attorney, Agent, or Firm—Douglas H. Lefeve

[57] ABSTRACT

In a differential amplifier circuit a closed loop bias adjustment circuit samples the lower of the output levels of the differential amplifier output stages to control a variable current source. This variable current source draws current from the amplifier to bias the output transistors thereof to provide optimum speed, maximum voltage swing, and minimum power dissipation.

9 Claims, 2 Drawing Figures

DIFFERENTIAL AMPLIFIER WITH AUTO BIAS ADJUST

TECHNICAL FIELD

This invention relates to differential amplifier circuits in general, and more particularly to a differential amplifier circuit including means to bias the output transistors thereof to provide optimum speed, maximum voltage swing, and minimum power dissipation.

BACKGROUND ART (Prior Art Statement)

Representative of the closest known prior art is U.S. Pat. No. 3,435,365 to J. C. Greeson, Jr., filed Oct. 1, 1965, issued Mar. 25, 1969, entitled "Monolithically Fabricated Operational Amplifier Device with Self-Drive", U.S. Pat. No. 3,551,836 to J. C. Greeson, Jr., filed Jan. 17, 1968, issued Dec. 29, 1970, entitled "Differential Amplifier Circuit Adapted for Monolithic Fabrication", and an article entitled "Amplifier with Automatic Gain Control" by H. L. Funk in the IBM *Technical Disclosure Bulletin*, Vol. 6, No. 3, pages 70-71 (August 1963).

The application of differential amplifier circuits for use as cathode ray tube (CRT) video amplifiers is well known in the prior art. In high speed operation of these amplifiers a large voltage swing, because of short dot times, has been desirable. However, a low output impedance inherent in the transistor amplifier circuitry coupled with the desirable large voltage swing translates to high power dissipation of the active output stages.

High power dissipation of an amplifier requires heat sinking. The heat sinking apparatus causes problems of unwanted capacitance (which reduces the speed of the circuitry) as well as additional costs and circuit packaging volume.

Although the power dissipated in a saturated portion of a differential amplifier is somewhat reduced from that dissipated in a similar portion of a differential amplifier circuit operated in a linear mode, the saturated mode leads to unacceptable delays in turning off this section of the differential amplifier circuit.

If the maximum current that can be conducted in either leg of the differential amplifier is too small the voltage swing of the amplifier circuit will be unacceptably low. Accordingly, for maximum voltage swing, optimum speed, and minimum power dissipation an optimum maximum current can be defined at which it is always desirable for one of the two legs of the differential amplifier circuit to conduct. This current is high enough to ensure adequate voltage swing but does not result in saturation of either output transistor which would have the undesirable result of time delays in switching and, therefore, decreased amplifier bandwidth. This optimum current, however, is substantially higher than that current at which maximum dissipation in the differential amplifier output transistors would occur.

It has, of course, been known in the prior art to employ closely regulated power supplies for a differential amplifier to achieve a stable set of desirable operating characteristics over the long term. However, with the present differential amplifier circuit it was recognized that significant power supply variations may occur. Thus, it was impossible to achieve with predictability a maximum optimum current at which the differential amplifier is to operate. It has, therefore, been apparent that to achieve this optimum current flow through the output devices of a differential amplifier under varying power supply conditions some type of automatic biasing arrangement is desirable.

A form of biasing that has heretofore been employed to control the current flow through the output devices of a differential amplifier is a variable current source connected between the junction of the two output devices and a voltage source. In the case of NPN transistors in the differential amplifier output stages, this current source is interposed between the junction of the emitters of these transistors and a negative voltage supply.

Each of the prior art references shows an arrangement of a variable current source connected between the junction of the emitters of the differential amplifier output transistors (NPN) and a negative voltage supply although in none of these references is the current source varied in accordance with this invention to set a constant optimum current. In U.S. Pat. No. 3,435,365 a portion of the output current is used to control the variable current source interposed between the emitters of the output transistors and a negative voltage source. As the output signal increases this current feedback causes a decrease in the current through the amplifiers so that an automatic gain function is realized. U.S. Pat. No. 3,551,836 is similar to U.S. Pat. No. 3,435,365 in that the total amplifier output current is sampled and is used in a feedback path to vary the amplifier gain. Also, the IBM *Technical Disclosure Bulletin* article of H. L. Funk describes another automatic gain control function implemented by using a variable current source between a junction of the emitters in an NPN differential amplifier and a negative voltage source. In the Funk circuit the amplifier output voltage is rectified and integrated to control the variable current source. In none of these prior art examples is the output voltage at each of the differential amplifier output transistors sampled and compared to a reference voltage or a base bias voltage of these transistors to maintain an optimum current flow through the amplifier to optimize the performance of the output transistors, keeping them out of saturation while otherwise maintaining a substantially low power dissipation.

DISCLOSURE OF THE INVENTION

Accordingly, in the improved differential amplifier circuit with automatic bias adjustment of this invention both of the amplifier outputs are sensed for the minimum voltage at either of these outputs. The lower of these voltages is compared with a reference voltage and circuitry is provided to maintain an optimum current flow through the amplifier which approaches a saturating current, but never saturates the output transistors. With this automatic bias adjustment feature the differential amplifier provides maximum voltage swing and optimum speed with minimum power dissipation.

The foregoing and other objects, features, extensions, and advantages of the invention will be apparent from the following more particular description of a preferred embodiment of the invention, as illustrated in the accompanying drawing.

BEST MODE FOR CARRYING OUT THE INVENTION

Figure 1:
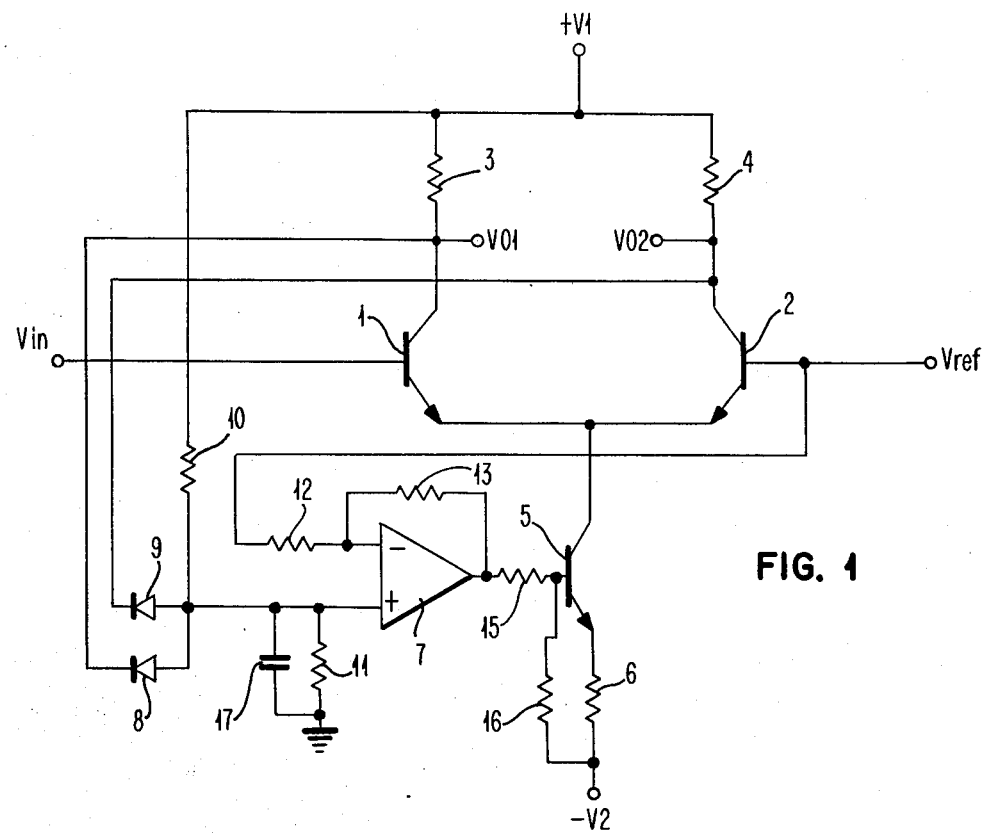
FIG. 1 is a schematic diagram of the differential amplifier circuit of this invention including the means for automatic bias adjustment.

Referring to FIG. 1, transistors 1 and 2 are the output transistors of a differential amplifier circuit. The differential amplifier circuit of this figure is shown in a classical form. More complex differential amplifier circuits have been shown in the prior art to which this invention is equally applicable, including a differential amplifier in which each of the two legs comprises a cascode circuit arrangement instead of a single output transistor. For the purposes of this description, therefore, transistors 1 and 2 are considered the output transistors of any differential amplifier arrangement.

Figure 2:
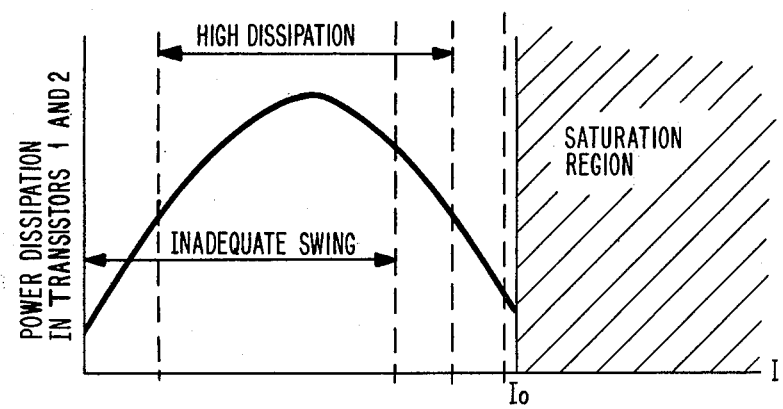
FIG. 2 is a curve showing differential amplifier output transistor power dissipation versus collector current to graphically show the result of automatically maintaining an optimum collector current as does the circuit of this invention.

Referring now to FIG. 2 a plot is shown of power dissipation in output transistors 1 and 2 versus collector current flow through the transistors. For the purposes of this description the curve shown in FIG. 2 is representative of the power dissipation in the one of the two output transistors 1 and 2 in which the greater collector current flows since, depending on the magnitude of the input voltage Vin relative to the reference voltage Vref, one of output transistors 1 and 2 is to be operated near saturation while the other of these two output transistors is to be operated at near cut-off.

In FIG. 2, considering the various operating points at which output transistors 1 and 2 can operate, a number of facts become apparent. First, for adequate voltage swing at the outputs of the amplifier large currents through the output stages are necessary for adequate voltage swings across the output load resistors. However, as stated previously, operation in the saturation region, which might be otherwise desirable in terms of low power dissipation, must be avoided in high speed amplifiers because of the delay involved in bringing the amplifier stage out of saturation. As current is decreased from the saturation point it is apparent in FIG. 2 that power dissipation increases toward the peak power dissipation shown on the curve. An arbitrarily defined range of "high" dissipation is shown and it will also be observed that, in addition to involving operation in the high dissipation region, an inadequate voltage swing will occur if the maximum current I1 that can flow in either amplifier leg is set to be substantially lower than the current required for saturation.

It will, therefore, be apparent from FIG. 2 that the optimum current flow to ensure maximum voltage swing, maximum speed, and minimum power dissipation is a current slightly below the saturation current. This current should be maintained through one of the amplifier legs in a stable manner, despite relatively wide variations in power supply outputs.

Referring again to FIG. 1 in the differential amplifier circuit shown an input voltage Vin is applied to the base of output transistor 1 while a reference voltage Vref is applied to the base of output transistor 2. The collectors of these output transistors 1 and 2 are connected to a voltage source V1 through load resistors 3 and 4. In the circuit shown transistors 1 and 2 are NPN and, therefore, the voltage source ends of resistors 3 and 4 are connected to the positive terminal of the voltage source, although, it will be obvious to those skilled in the art that PNP transistors could be used throughout the circuit of FIG. 1, rather than NPN transistors with opposite polarities of the two voltage sources.

In this differential amplifier circuit the output voltages V01 and V02 are taken at the collectors of the output transistors 1 and 2. The emitters of transistors 1 and 2 are connected together and are also connected to the collector of transistor 5 which forms the output portion of the automatically adjusted current source of the differential amplifier. The emitter of transistor 5 is connected through a resistor 6 to a negative potential V2 while the base of transistor 5 is connected through resistor 15 to the output of operational amplifier 7, the operation of which, in conjunction with the remainder of the automatic biasing circuitry, will now be described in detail.

The cathodes of diodes 8 and 9 are connected to the collectors of output transistors 1 and 2, respectively. The anode of diodes 8 and 9 are connected together at the non-inverting input of operational amplifier 7. Resistors 10 and 11 form a DC voltage divider with the ratio of the resistors chosen to initially provide, during circuit starting, a voltage at the non-inverting input of amplifier 7 which is slightly greater than one diode drop more than the lower of the two V01, V02 output voltages.

For an analysis of the circuit operation assume that Vref is set at 2.0 volts and that Vin has two states, the lower of which is 1.5 volts and the upper of which is 2.5 volts. The ratio of resistors 12 and 13 and resistors 15 and 16 are chosen to control transistor 5 to draw current out of the emitters of transistors 1 and 2 as required to maintain V01 and V02 at the chosen output magnitudes, which will insure that neither of these transistors is driven to the point of saturation.

Assume now that Vin is at its highest state of 2.5 volts. This turns on transistor 1 and turns off transistor 2. If the current flow through transistor 5 is such that the collector of transistor 1 drops to 3.0 volts, then transistor 1 is not saturated. With the assumption that V01 is at three volts, both of the inputs of amplifier 7 are at 3.7 volts. This assumes that the operational amplifier 7 is operating in its active mode such that the inputs must be equal. Thus, 1.7 volts is dropped across resistor 12 and the voltage at the junction of resistors 13 and 15 is the current through resistor 12 multiplied by the resistance of resistor 13, added to 3.7 volts.

The collector of transistor 5 is at 1.8 volts and the emitter voltage of transistor 5 is determined by the current through the differential amplifier circuit (approximately 27 volts divided by the resistance of resistor 4 multiplied by the resistance of resistor 6 algebraically added to the potential of the negative voltage V2). The base voltage of transistor 5 is then assumed to be 0.7 volts higher than the emitter voltage of transistor 5 and, therefore, the ratio of the resistance of resistors 15 and 16 can be determined.

Thus, the ratio of resistors 12 and 13 and the ratio of resistors 15 and 16 determine the amount of current flow through the higher current leg of the differential amplifier circuit which, in turn, sets the voltages V01 and V02. Before considering current flow in the opposite leg of the differential amplifier circuit consider the effect of an increase in V1 on the circuit operation. This will cause V01 to rise which would increase the voltage at the inputs of amplifier 7. This, in turn, will result in more current being drawn through resistors 12 and 13 and, therefore, a higher positive voltage at the output of amplifier 7. This provides a less negative voltage at the base of transistor 5 and, therefore, a greater current flow through transistor 5 and out of the differential amplifier. This greater current flow out of the differential amplifier provides a greater voltage drop across resistor 3 which lowers the output voltage V01 back down to the 3 volt level. Conversely, a decrease in V1 causes a lower current to flow to maintain the same V01.

Assume now that the Vin voltage drops from 2.5 volts to 1.5 volts. The emitter voltage of transistors 1 and 2 now assumes a value of 1.3 volts or 0.5 volts lower than before. The base biasing for transistor 5 does not change and, therefore, the current through transistor 5 and through transistor 2 and resistor 4 remain equal to the current drawn previously when transistor 1 and resistor 3 were conducting. V02 will be the same value as V01 was previously, provided resistors 3 and 4 are of the same value and transistors 1 and 2 have substantially high gains.

When the Vin voltage was dropped below the Vref voltage, transistor 1 was turned off. During any switchover capacitor 17 serves to momentarily hold the voltage at the inputs of amplifier 7 at the level immediately prior to the switchover for stabilizing purposes. It is also assumed that amplifier 7 has relatively slow response or some equivalent capacitance between the inverting input and the output.

Thus, an improved differential amplifier circuit has been shown which includes an automatic bias adjustment circuit in which the amplifier outputs are sensed for the minimum voltage at either of these outputs. The lower of these voltages is compared with a base bias voltage which, in the case of the amplifier shown, is the reference voltage applied as one of the differential amplifier inputs. Circuitry is provided to maintain an optimum current flow through the amplifier to provide a maximum voltage swing and optimum speed of the amplifier by not saturating the output transistors while also providing a minimum power dissipation by regulating this current at a level approaching saturation.

While the invention has been shown and described with reference to a particular embodiment thereof, it will be understood by those skilled in the art that the foregoing and other changes in form and details may be made therein without departing from the spirit and scope of the invention. For example, each of the two output stages of the differential amplifier, while shown in the simplest form for this description, might, instead be comprised of cascode circuitry.

I claim:

1. In a differential amplifier circuit having first and second complimentary outputs, the improvement comprising;
   means for individually sensing the voltages of both differential amplifier outputs; and
   means responsive to the minimum of said sensed differential amplifier output voltages for controlling current flow out of said amplifier to maintain said minimum voltage value at a predetermined, constant level.

2. In the differential amplifier circuit of claim 1 wherein said means for controlling current flow further comprises a current source transistor connected between a first voltage source and the emitters of a pair of transistors in said differential amplifier.

3. In the differential amplifier of claim 2 wherein said means for controlling current further comprises an operational amplifier for controlling the relative conductivity of said current source transistor.

4. In the differential amplifier of claim 3 wherein a first input of said operational amplifier is connected to sense a bias voltage of at least one transistor in said differential amplifier.

5. In the differential amplifier of claim 4 wherein a second input of said operational amplifier is connected to sense said minimum voltage value of said differential amplifier.

6. In the differential amplifier of claim 5 wherein said second input of said operational amplifier is connected to each of the outputs of said differential amplifier through separate diodes which are back biased with respect to a second voltage source.

7. In the differential amplifier of claim 6 further comprising a voltage divider connected between said second voltage source and ground, said voltage divider having its divider terminal connected to said second input of said operational amplifier to cause one of said diodes to conduct at all times.

8. In the differential amplifier circuit of claim 7 wherein said means for controlling current flow includes capacitive means for stabilizing operation of said controlling means during amplifier switching.

9. In the differential amplifier of claim 8 wherein the emitter of said current source transistor is connected to said first voltage source through a resistor.

* * * * *